United States Patent [19]

Kim et al.

[11] Patent Number: 5,003,372
[45] Date of Patent: Mar. 26, 1991

[54] HIGH BREAKDOWN VOLTAGE SEMICONDUCTOR DEVICE

[75] Inventors: Jong O. Kim, Seoul; Jin H. Kim, Chung-Buk, both of Rep. of Korea

[73] Assignee: Hyundai Electronics Industries Co., Ltd., Rep. of Korea

[21] Appl. No.: 364,624

[22] Filed: Jun. 9, 1989

[30] Foreign Application Priority Data

Jun. 16, 1988 [KR] Rep. of Korea ............... 88-7206
Jun. 16, 1988 [KR] Rep. of Korea ............... 88-7207
Jun. 16, 1988 [KR] Rep. of Korea ............... 88-7208

[51] Int. Cl.$^5$ ............................................. H01L 29/40
[52] U.S. Cl. ........................................ 357/53; 357/55; 357/15
[58] Field of Search .................. 357/55, 53, 15, 13, 357/23.7

[56] References Cited

U.S. PATENT DOCUMENTS

| 4,009,483 | 2/1977 | Clark | 357/52 |
| 4,270,137 | 5/1981 | Coe | 357/53 |
| 4,399,449 | 8/1983 | Herman et al. | 357/52 |
| 4,412,242 | 10/1983 | Herman et al. | 357/53 |
| 4,567,502 | 1/1986 | Nakagawa et al. | 357/53 |

FOREIGN PATENT DOCUMENTS 56-35463 4/1981 Japan ........................ 357/55

Primary Examiner—William D. Larkins
Assistant Examiner—D. Monin

[57] ABSTRACT

A semiconductor device having a grooved field plate(s), a grooved field limiting ring(s) or a combination of a grooved field plate(s) and grooved field limiting ring(s) is disclosed. The grooved modification of the conventional semiconductor results in an increased break-down voltage over the conventional semiconductor device. A method for manufacturing the grooved semiconductor device is disclosed.

14 Claims, 3 Drawing Sheets

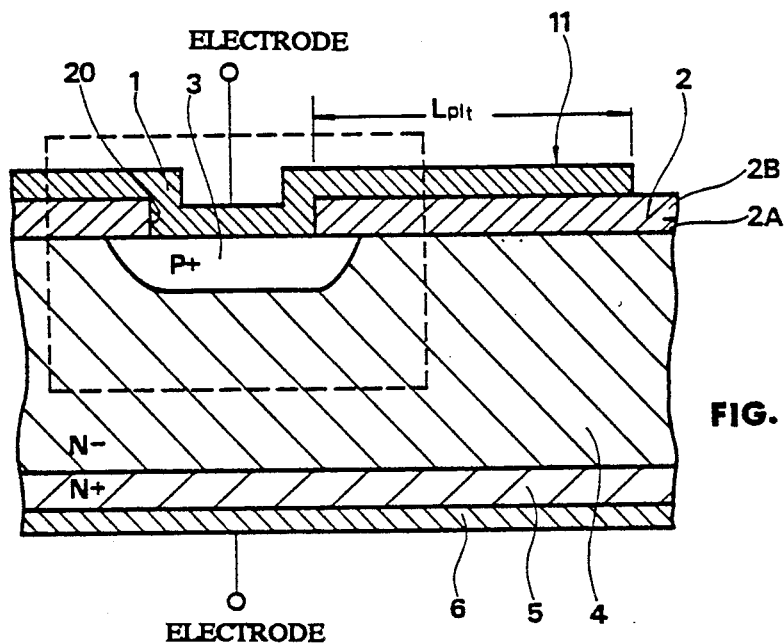
FIG. 3A
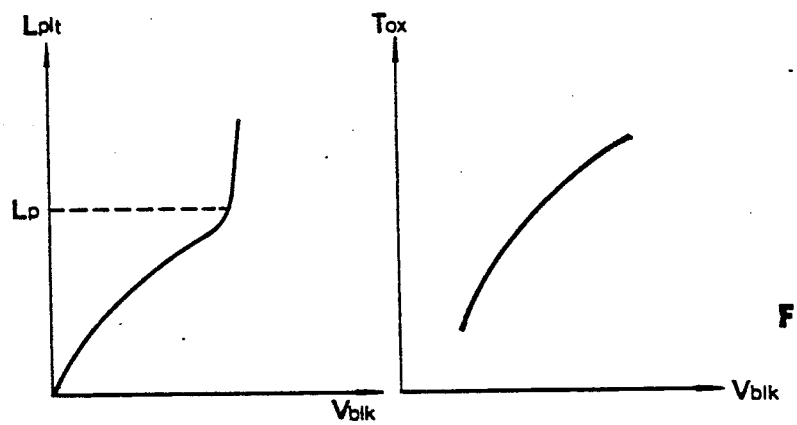
FIG. 3B
FIG. 3C
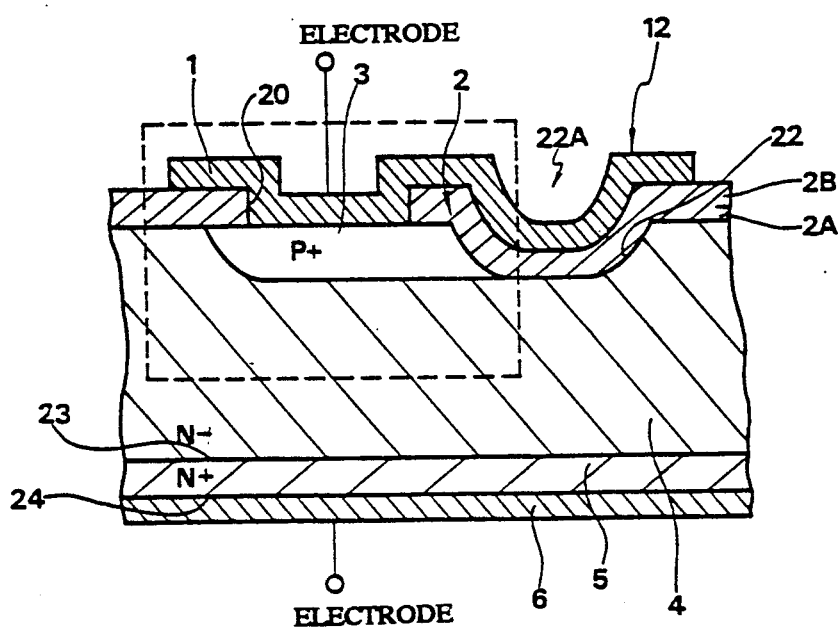
FIG. 4

HIGH BREAKDOWN VOLTAGE SEMICONDUCTOR DEVICE

BACKGROUND OF THE INVENTION

1. Field of the Invention

This invention relates to a semiconductor device which is constructed to a have high break-down voltage and to a method for manufacturing the device, and more particularly to a high voltage semiconductor device with an etched groove formed around a main junction by known etching technology, on which a grooved field plate and a grooved field limiting ring are utilized in order to increase the break-down voltage, and a method for manufacturing such semiconductor device.

2. Information Disclosure Statement

Generally, in order to make a high voltage semiconductor, many P-N junctions are arranged in parallel on a silicon substrate. When a high voltage is applied to such a structure in the reverse direction, there are problems which cause failure of the semiconductor device in normal operation since break-down occurs, very often, at the edge of a highly integrated chip.

In the prior art, attempts had been made to protect the semiconductor device against such failure. For example, one attempt at solving the problem formed a field limiting ring with diffusion material having the same type of impurity as that of the P+ diffusion region of the main junction at the edge of highly integrated chips.

However, this prior art method results in a design problem of the device because the number of field limiting rings must be increased at high voltage, resulting in problems manufacturing the integrated device.

A second approach had been proposed to eliminate the problem occurring in the prior art. This approach used as an anode electrode a field plate which was formed on an insulating layer to a desired length around the main junction of the device at the edge of highly integrated chips so that it is possible to make a large depletion of the main junction of the P+ type diffusion region and N− epitaxial layer. Due to this structure, the break-down voltage is increased, and failure in the device could be avoided.

However, there is a problem integrating the devices because of the extension of the field plate. Also, a further problem occurs when the length of field plate is over a certain length, since the break-down voltage does not increase further and the thickness of the insulating layer must be of a thickness that is difficult to obtain in the known semiconductor treatment process.

A third prior art device is formed by a combination of the first and second prior art devices. This device is constructed by a combination of the field plate and the field limiting ring around the main junction of the device in a highly integrated semiconductor device. Here the field plate is extended to a desired length from the main junction, and the field limiting ring is formed by a diffusing process with the material (the same material as the main junction) having the opposite type of semiconductor substrate. With this process, high break-down voltage semiconductor devices have been manufactured.

However, in the case of manufacturing a high breakdown voltage semiconductor device using the combined structure of the field plate and the field limiting ring, a large amount of space is needed. Furthermore, problems occurred in designing the semiconductor device because of the plurality of field rings required, resulting in a high cost of the device.

Accordingly, it is an object of the present invention to provide a high voltage semiconductor device that provides a significant advancement over the prior art devices.

It is another object of the present invention to provide a semiconductor device having an improved high break-down voltage in a reverse direction and to provide a method for manufacturing such semiconductor devices.

SUMMARY OF THE INVENTION

In order to solve the problem occurring in the prior art, according to the present invention, after grooves are formed in the N− epitaxial layer, using known etching technology, the grooves are formed at the portion at which the P+ diffusion region as a field limiting ring was formed around the main junction of the prior art device. An insulating layer is then deposited into the groove. Conducting material is then deposited on the insulating layer thereby forming a plurality of floating electrodes, which may be referred to as grooved field limiting rings. The methods which provide the openings through the insulating layers at the sites of the P+ diffusion regions and methods of depositing the conducting material are well known to the skilled in the art making further explanation of such methods unnecessary.

Accordingly, the total magnitude of break-down voltage can be obtained by adding the magnitude of break-down voltage at the insulating layer in the grooved field limiting rings so that the device constructed in accordance with present invention can achieve a break-down voltage higher than the field limiting ring structure of the prior art.

According to a second embodiment of present invention, after a desired groove is formed at a side of or around the P+ diffusion region of a main junction of the device, an insulating layer is deposited on the groove. Conducting material is then deposited in the groove to form a field plate in the main junction.

According to the present invention by forming the field plate, along the groove the length of the flat surface of the field plate is reduced effectively compared to the prior art field plate. Also it is possible to increase the break-down voltage at the insulating layer in the groove, thereby making it possible to manufacture highly integrated semiconductor devices. In order to alleviate the problem of the third prior art combination semiconductor device, the third embodiment of present invention utilizes a structure in which the field plate region and the field limiting ring are formed by etching a groove around the main junction of the prior art device. That is, a groove is formed by etching, in the field limiting ring and the field plate. After the grooves in the field plate and in the field limiting ring region are filled with insulating material, the same electrode as the main junction is formed in the groove field plate and a floated electrode is formed in the groove field limiting ring respectively.

Therefore, according to the third embodiment of present invention the length of the flat surface of the field plate is reduced significantly since a portion of the length of the field plate is received are the contour of the groove. The structure of the present invention has an improved break-down voltage relative to the prior art, by reducing the electric field with the insulating layer in the grooved field plate and in the grooved field limiting rings. The floating electrode on the groove has the same property as in the prior art field limiting ring. Furthermore, there is no need to use a diffusion process to form the field limiting ring so that the requirements for designing a semiconductor device are not so strict.

BRIEF DESCRIPTION OF THE DRAWINGS

For a fuller understanding of the nature and objects of the invention, reference should be made to the following detailed description taken in connection with the accompanying drawings in which:

FIG. 3A illustrates a cross-section of a second prior art high voltage semiconductor device having a field plate at the main junction;

FIG. 3B is a graph showing the relationship between the break-down voltage and the length of field plate provided at main junction of the high voltage semiconductor device shown in the FIG. 3A;

FIG. 3C is a graph showing the relationship between the thickness of insulating layer and the break-down voltage;

FIG. 4 is a second embodiment of a high voltage semiconductor device according to the present invention;

Figure 1A:
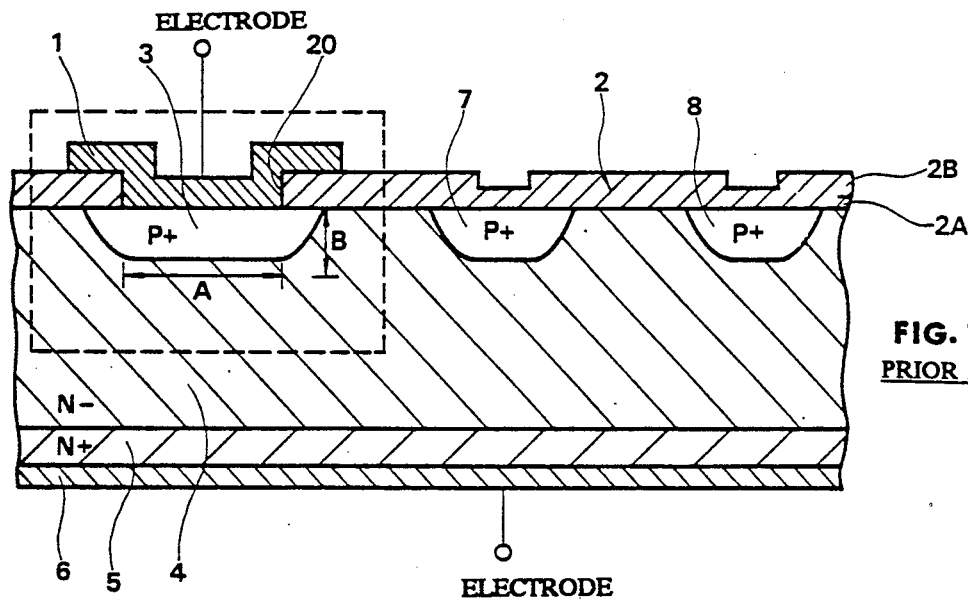
FIG. 1A illustrates a cross-section of the first prior art semiconductor device provided with field limiting rings.

The novel feature of the present invention may be better understood from the accompanying description when taken in conjunction with the accompanying drawings.

DETAILED DESCRIPTION OF THE DRAWING

FIG. 1A illustrates a cross-section of an example of a prior art semiconductor device. More specifically, after a N− epitaxial growth layer 4 is deposited on a N+ substrate 5, an insulating layer 2 is deposited which has the first and second insulating layers 2A,2B and a P+ diffusion region 3 is formed by diffusion of P+ impurity.

If a bias is applied to the anode and cathode electrode, a depletion layer is produced around the main junction. It is usual that the depletion layer near the side of P+ diffusion region 3 (cylindrical region:region B) is smaller than that under P+ diffusion region 3 (planar region:region A) so that the break-down phenomenon caused by a strong electric field formed at both ends of the depletion layer easily occurs at the side of P+ diffusion region ("B" region). To compensate for this, the field limiting rings 7,8 of P+ diffusion regions are formed at the position so the depletion area can be extended in horizontal direction near the B region of the main junction part. By this, it is possible to increase the voltage at which the break-down occurs. Hereinafter, in order to explain the break-down voltage in the P+ diffusion region, the block, including "A" and "B" regions, represented by the dotted line box in the figures will be referred to as the "main junction".

It is noted that the main junction, well known in the art, is formed after removing a portion ("A" region) of the insulating layer 2 on P+ diffusion area 3 which is formed by diffusing P+ impurity into the N− Epitaxial layer 4, then depositing the conducting material 1 on a portion of the insulating layer 2 and over the area ("A" region) absent the insulating layer 2, so that between the anode electrode (formed by drawing out from the conducting material 1) and the cathode electrode (drawn from the conducting material(6), as will be described later,) bias is applied. The main junction described above is usually considered a basic structure of the semiconductor device. As described above in the prior art a plurality of field limiting rings are disposed proximate the main junction so as to increase the break-down voltage in the main junction.

Figure 1B:
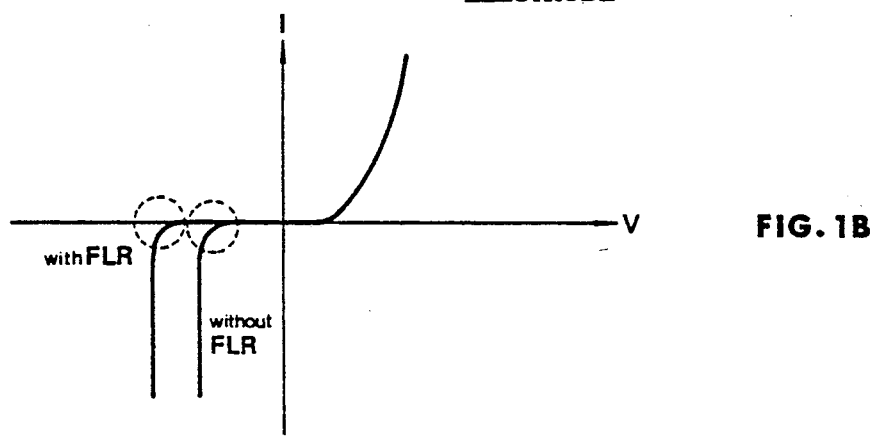
FIG. 1B illustrates the breakdown voltages in the prior art semiconductor device with a field limiting ring or without a field limiting ring.

FIG. 1B illustrates a schematic graph of the V-I(voltage "V", current "I") property in comparison with the high voltage device having only a main junction and that having a main junction with field limit rings. It is understood that the break-down voltage is increased by the field limiting ring structure in the figure.

However, even though the high voltage semiconductor device includes a field limiting ring, it is not satisfactory in meeting the requirements for the present day electronic applications of the semiconductor technology since it does not provide sufficient break-down voltage. Further, there is a problem in designing the device because of the use of a plurality of field limiting rings in a limited space.

Figure 2:
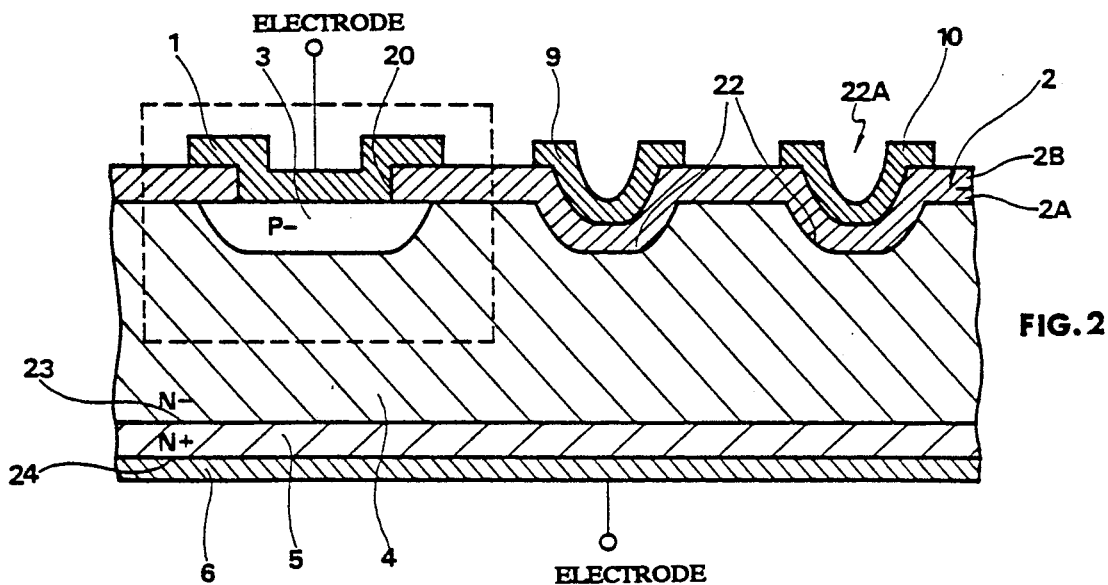
FIG. 2 illustrates a cross-section of a first embodiment of a high voltage semiconductor device having floating electrodes according to the present invention.

The first embodiment of the high voltage semiconductor device according to the present invention is depicted in a cross-sectional view at FIG. 2. The interface of individual insulating layers is not illustrated in the drawing for sake of clarity but the insulating layer 2 consists of the first and second insulating layers 2A,2B. There is only second insulating layer 2B, which follows the contour of the groove 22 since the first insulating layer 2A was removed during formation of the groove 22. After eliminating a part of the insulating layer 2 on the P+ diffusion region 3, conducting material 1 is deposited to form the main junction, from which an anode electrode is drawn out. On the other hand, conducting material 6 is deposited under the N+ substrate 5 so as to form a cathode electrode.

The basic structure of the main junction and the device of the present invention is substantially same at that depicted in FIG. 1A except for grooves 22 formed in the field limiting rings 7,8, for example by etching The N− epitaxial growth layer 4 is formed on the first side 23 of N+ silicon substrate 5. The insulating layer 2A is then deposited on the N− epitaxial growth layer 4, as illustrated at FIG. 2. The P+ diffusion region 3 is then formed by diffusion together with redepositing the second insulating layer 2B. Then, a portion of the insulating layer 2 is etched and eliminated to provide grooves 22 and an opening 20 through the insulating layer 2 in order to enable the conducting material 1 to contact the P+ diffusion region 3 which will be described hereinafter. The conducting material 6 is deposited on the second side 24 of N+ silicon substrate for a cathode electrode. Also, the conducting material 1, e.g. polysilicon, is deposited on the insulating layer 2B in the grooves 22. In this case, such portions are called as floating electrodes 9, 10 because they are floating electrically. The floating electrodes formed in accordance with this invention serves as the prior art field limiting rings. The high break-down ability is improved by the insulating layer 2B positioned under the floating electrodes 9, 10. The magnitude Vblk of high break-down voltage produced by a bias applied across the prior art device equals the sum of the depleted voltage Vsub in the semiconductor substrate and the voltage Vflr produced by the field limiting region 7,8, that is Vblk=Vsub+Vflr, while the magnitude Vblk of high break-down voltage in the device according to the present invention equals the sum of the voltage Vsub, the voltage Vgflr (formed by the groove 22) and the voltage in the glass used as the insulating layer 2, that is, Vblk =Vsub+Vgflr+Vglass.

As a result, according to the present invention, it is possible to increase the break-down voltage by the voltage Vglass as compared with the prior art.

FIG. 3A depicts another example of the prior art device illustrating a cross-section of a high voltage semiconductor device comprising a field plate 11. In this figure, after N− epitaxial growth layer 4 is deposited on the N+ substrate 5, the insulating layer 2A, e.g. glass, is deposited on layer 4. P+ impurity is then diffused into a portion of the N− epitaxial growth layers together with redepositing the insulating layer 2B. Next, the insulating layer 2 deposited on the P+ diffusion region 3 is eliminated by etching to form an opening and the conducting material 1 is deposited so that the flat field plate 11 is formed. Finally, the anode electrode is attached to the conducting material 1 in the main junction, while the conducting material 6 is deposited on the second side of N+ substrate and a cathode electrode is attached thereto. Using this process, another example of the prior art semiconductor device is constructed.

When the field plate 11 of prior art is formed to the length illustrated at FIG. 3A, the electric field is produced in the N− epitaxial layer 4 by the bias applied between the anode and the cathode, and the depletion layer becomes larger at side of P+ diffusion region 3. Thus, the improvement of break-down voltage is achieved.

However, such semiconductor devices have problems since the length of flat field plate 11 is too long. Also, it is very difficult to improve stability under high voltage operation because in use in the main junction the depletion layer is formed by the bias applied by anode and cathode electrode and the magnitude of break-down voltage is determined by the crystalline in the semiconductor device.

FIG. 3B illustrates the correlation between the length of field plate 11 and the break-down voltage produced by said field plate. From the figure, it can be seen that the break-down voltage varies according to the length of flat field plate 11. Particularly, the break-down voltage increases in proportion to the length Lplt of the field plate 11 up to the point Lp. After this point, the break-down voltage remains constant regardless of the length of field plate 11. Thus, it is very clear that there are limits in the prior art to extent of improvement in the high voltage property.

FIG. 3C shows the relation between the thickness Tox of the insulating layer and the break-down voltage Vblk. From the figure it can be seen that for high voltage semiconductor device the thickness of the insulating layer has to have a thickness that may be difficult to obtain in the known semiconductor device treatment process.

FIG. 4 shows schematic cross-section of the second embodiment of a high voltage semiconductor device according to the present invention, wherein the N− epitaxial growth layer 4 is deposited on the first side 23 of N+ silicon substrate 5, after which the insulating layer 2A is deposited thereon. The P+diffusion region 3 of main junction is formed into the N− epitaxial growth layer 4 by diffusion to the desired depth. Proximate the side of the P+ diffusion region 3, a groove 22 is etched. The insulating layer 2B is again deposited in the groove 22. Then, a portion of insulating layer 2 over the P+ diffusion region 3 is eliminated by etching. The field plate 12 is then formed by depositing the conducting material 1 continuously from the P+ diffusion region 3 to the groove 22 located near the side of the P+ diffusion region 3. An cathode electrode is drawn out from the conducting material 6 deposited on the second side 24 of N+ substrate 5 and the anode electrode is drawn out from the conducting material 1 as shown in FIG. 4.

The semiconductor device manufactured by the method described above overcomes the disadvantages which the magnitude of the break-down voltage is depending upon the crystalline substrate of the semiconductor device in which a depletion layer is formed in the main junction part of semiconductor. Further, according to the present invention it is possible to reduce the length of the semiconductor substrate by forming the field plate 12 along a groove 22. Thus, the size of the chip can be reduced significantly. Also, the device according to the present invention has high stability under high voltage operation.

Figure 5:
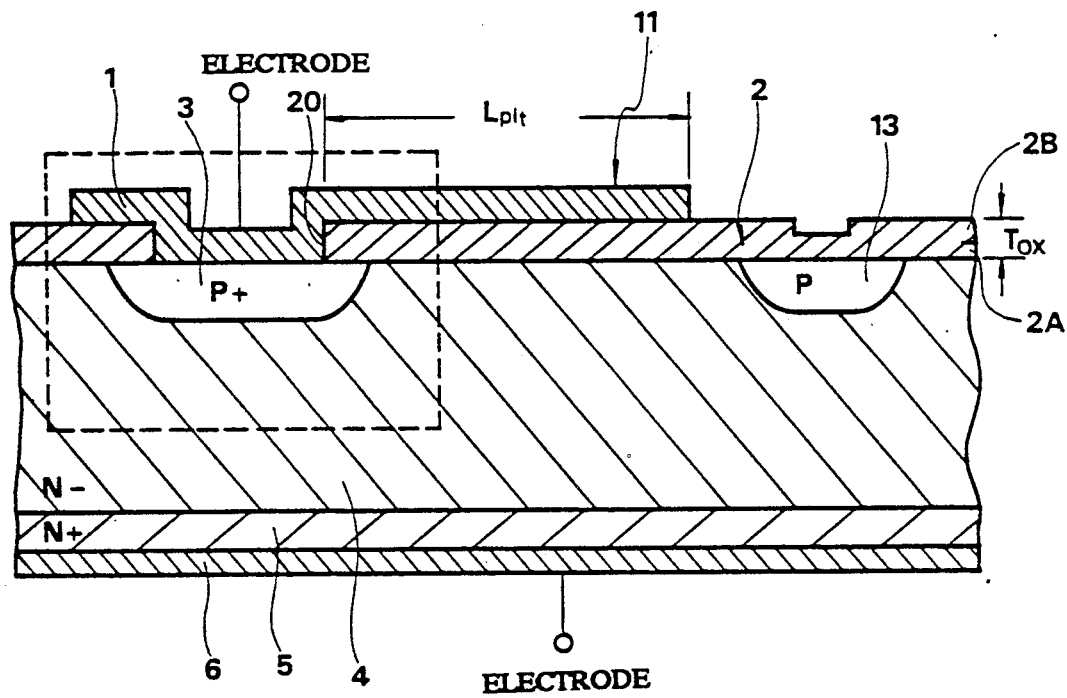
FIG. 5 illustrates a cross-section of a third prior art high voltage semiconductor device which is the combination form having the field limiting structure of the embodiment of prior art illustrated at FIG. 1A and the field plate structure of the device of prior art illustrated at FIG. 3A.

FIG. 5 depicts a cross-section of the third device of the prior art high voltage semiconductor device, that is, the combination form of the field plate structure 11 of the second device of the prior art and the field limiting ring in the first device of the prior art. N− epitaxial growth layer 4 is deposited on the N+ substrate 5. After the insulating material 2A is deposited on the N− epitaxial growth layer 4, the P+ diffusion regions 3,13 and field limiting ring 25 can be formed and the insulating material is deposited thereon again. Then, a portion the insulating layer 2 on the P+ diffusion region 3 is eliminated, after which the conducting material 1 is deposited in order to form the field plate 11. The anode electrode is attached to the conducting material 1 on the P+ diffusion region 3, while at the second side of the N+ substrate 5, the conducting material 6 is deposited to form the cathode electrode.

Therefore, with the semiconductor having a structure formed in the combination of the field limiting ring 25 and the field plate 11 in the prior art, it was possible to increase the break-down voltage. However, the resulting semiconductor still had disadvantages. There are problems integrating the semiconductor device since the surface area of field plate becomes quite large. Also, the number of field limiting rings 25 must be increased as the voltage applied to the device becomes high.

Figure 6:
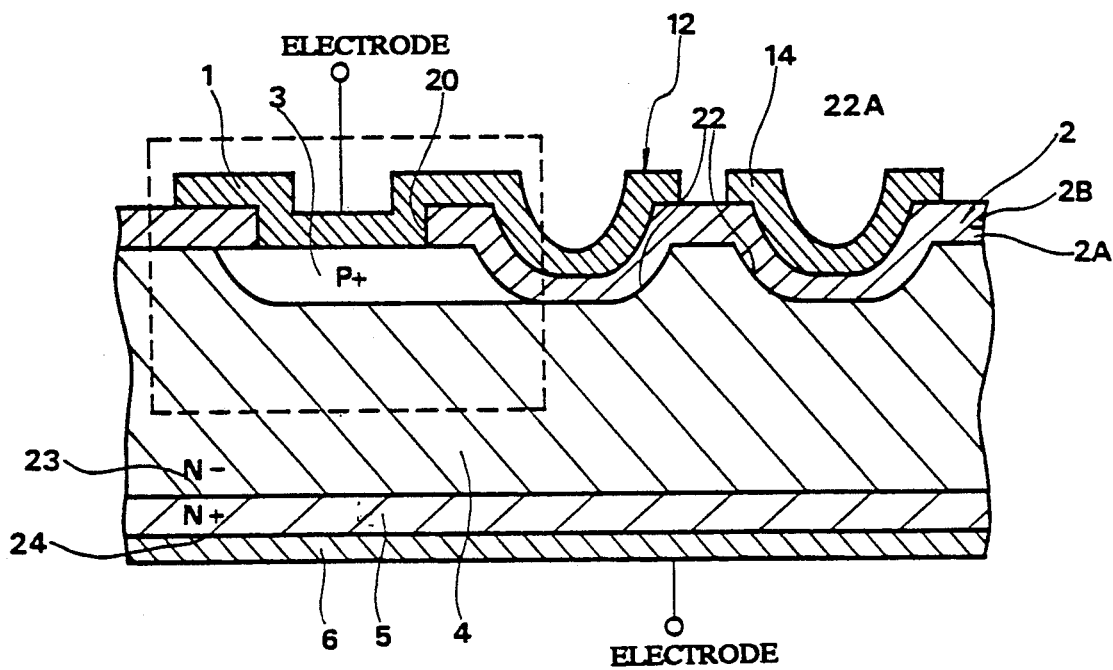
FIG. 6 illustrates a cross-section of a third embodiment according to the present invention having a combined structure of the first embodiment and the second embodiment of present invention.

Accordingly, in order compensate for the problems occurring in the third prior art device, a third embodiment according to the present invention was developed which employs the structure set forth at FIG. 6. The device includes a P+ diffusion region 3 formed to desired depth in the main junction, and etched grooves 22 at the area proximate the side of P+ diffusion region 5 and spaced therefrom. An insulating layer 2 and conducting material 1 are utilized in the same manner described before. The resulting semiconductor device of the present invention includes a high break-down voltage limiting ring utilizes etching rather than diffusion P+ impurity, is illustrated at prior art FIG. 1.

Reference is made FIG. 6 which illustrates a cross-section of the third embodiment of present invention, that is, illustrating a cross-section with the combined structure shown in FIGS. 2 and 4.

In accordance with the method of present invention, N− epitaxial growth layer 4 is deposited on the first side 23 of N+ silicon substrate 5. An insulating layer 2A is then deposited on the N− epitaxial growth layer. The P+ diffusion region 3 is formed at the main junction shown in the N− epitaxial layer 4. Etching is performed to the desired depth at the area proximate the P+ diffusion region, and spaced therefrom. After the etching process an insulating layer 2B is deposited on the first insulating layer 2A, except for the openings formed over the P+ diffusion layer. Then conducting material 1 is deposited on the P+ diffusion region 3. Also the conducting material is removed which is located between two grooves 22 to form the portion serving as the field plate 11 and the groove 22 field limiting ring 14, that is, a floating electrode 14. Finally, the anode electrode is attached to the conducting material 1 on the P+ diffusion region 3 and the cathode electrode is attached is attached to the conducting material 1 on the P+ diffusion region 3 and the cathode electrode is attached to the second side 24 of N+ substrate 5 on which the conducting material 6 is deposited.

When the bias is applied, in use, to the cathode and anode, the depletion layer produced in the N− epitaxial growth layer 4 and the area proximate the P+ diffusion region 3 is extended widely by the field plate 12 formed on the one groove 22A, the floating electrode 14 on another groove 22 separated from the groove 22 adjacent the P+ diffusion region 3 and the insulating layer 2 under the conducting material so that the break-down voltage of the semiconductor device can be increased. In accordance with the semiconductor device of present invention, the length of field plate 12 can be diminished effectively since the field plate 12 is formed along the surface of etched groove 22. Also, by adding the break-down voltage produced by the insulating layer 2 on the grooves which are formed in the field plate region and under the floating electrode, a higher break-down voltage of the present invented semiconductor device can be increased effectively produced.

A method for manufacturing a high break voltage semiconductor device having floating electrodes comprises providing a N+ silicon substrate 5 with a N− epitaxial layer 4 deposited on the first side 23 of the N+ silicon substrate 5 and a first insulating layer 2A deposited on the N− epitaxial layer 4. A plurality of grooves 22 is then formed with each groove 22A extending through the first insulating layer 2A, and into the N− epitaxial layer 4 and being spaced adjacent to each P+ diffusion region of a plurality of P+ diffusion regions. A plurality of P+ diffusion regions is formed by diffusing a P+ impurity into a plurality of sites on the N− epitaxial layer 4. A second insulating layer 2B is deposited to contourly coat the grooves 22 extending through the first insulating layer 2A and into the N− epitaxial layer 4. An opening 20 is then formed by removing a portion of the first and the second insulating layers 2A,2B positioned over each P+ diffusion region 3 of the plurality of P+ diffusion regions. Conducting material 1 is deposited into the opening 20 and over the second insulating layer 2B which is deposited on the first insulating layer 2A. The conducting material 1 deposited on the second insulating layer 2B is removed while maintaining a substantially constant thickness of the conducting material independently at each opening 20 through the first and second insulation layers 2A,2B and at each groove 22 A coated by the second insulating layer 2B and extending through the first insulating layer 2A and into the N− epitaxial layer 4. An anode electrode is attached to the conducting material 1 deposited at the opening 20 positioned over each P+ diffusion region of the plurality of P+ diffusion regions, and a cathode electrode is attached to the conducting material 6 on the second side 24 of the substrate 5. The plurality of grooves 22 extending through the insulating layer 2A and into the N− epitaxial layer 4 are formed preferably by etching. Also, the opening 20 formed through the first and the second insulating layers 2A,2B positioned over each P+ diffusion region 3 of the plurality of P+ diffusion regions are preferably formed by etching.

A method for manufacturing a high break voltage semiconductor device having a field plate comprises providing a N+ silicon substrate 5 with a N− epitaxial layer 4 deposited on the first side 23 of the N+ silicon substrate 5 and a first insulating layer 2A deposited on the N− epitaxial layer 4. A plurality of grooves 22A are then formed with each groove 22 A extending through the first insulating layer 2A and into the N− epitaxial layer 4 and being positioned adjacent to each P+ diffusion region 3 of said plurality of P+ diffusion regions. A plurality of P+ diffusion regions are then formed by diffusing a P+ impurity into a plurality of sites on the N− epitaxial layer 4. A second insulating layer 2B is deposited to contourly coat the grooves 22 extending through the first insulating layer 2A and into the N− epitaxial layer. An opening 20 is then formed by removing the first and the second insulating layers 2A,2B positioned over each P+ diffusion region of the plurality of P+ diffusion regions. Conducting material 1 is then deposited into the opening 20 and over the second insulating layer 2B deposited on the first insulating layer 2A. The conducting material 1 deposited on the second insulating layer 2B is maintained and has a substantially constant thickness and which coats together each opening 20 and each groove 22A positioned adjacent to each P+ diffusion region 3 of the plurality of P+ diffusion regions thereby providing a field plate at each location. The remaining conducting material is removed. An anode electrode is then attached the conducting material 1 deposited at the opening 20 positioned over each P+ diffusion region of the plurality of P+ diffusion regions and a cathode electrode is attached to the conducting material 6 on the second side 24 of the substrate.

The plurality of grooves 22 extending through the insulating layer 2A and into the N− epitaxial layer 4 are preferably formed by etching. Preferably, the opening 20 through the first and the second insulating layers 2A,2B positioned over each P+ diffusion region 3 of the plurality of P+ diffusion regions are formed by etching. A method for manufacturing a high break voltage semiconductor device having floating electrodes and field plates in combination comprises providing a N+ silicon substrate 5 with a N− epitaxial layer 4 deposited on the first side 23 of the N+ silicon substrate 5 and a first insulating layer 2A deposited on the N− epitaxial layer 4. A plurality of grooves 22 extending through the first insulating layer 2A and into the N− epitaxial layer 4 is formed. A plurality of P+ diffusion regions is formed by diffusing a P+ impurity into a plurality of sites on the N− epitaxial layer 4. A second insulating layer 2B is deposited to contoury coat the grooves 22 extending through the first insulating layer 2A and into the N− epitaxial layer 4. An opening 20 is formed by removing the first and the second insulating layers 2A,2B positioned over each P+ diffusion region of the plurality of P+ diffusion regions. The conducting material 1 is deposited into the opening 20 and over the second insulating layer 2B deposited on the first insulating layer 2A. A groove 22 formed in the N− epitaxial layer 4 adjacent to each P+ diffusion region 3 of the plurality of P+ diffusion regions is provided and with each groove 22A being contoury coated by the second insulating layer 2B. While maintaining a substantially constant thickness of the conducting material at each groove 22 coated by the second insulating layer 2B and extending through the first insulating layer 2A and into the N− epitaxial layer 4 to provide floating electrodes, the conducting material 1 deposited on the second insulating layer 2B is removed. A substantially constant thickness of conducting material 1 is maintained to enable the conducting material covering the opening 20 to extend to also contoury cover the insulating layer 2 coated adjacent groove 22 thereby forming a field plate 12 at each covered opening 20 the corresponding adjacent groove 22. An anode electrode and a cathode is attached to the conducting material deposited at the opening 20 positioned over each P+ diffusion region 3 of the plurality of P+ diffusion region and to the conducting material on the second side 24 of the substrate, respectively. The plurality of grooves 22 extending through the insulating layer 2A and into the N− epitaxial layer 4 are preferably formed by etching. Also, the opening 20 through the first and second insulating layers 2A,2B positioned over each P+ diffusion region of the plurality of P+ diffusion region 3 are preferably formed by etching.

The conducting materials insulating materials and metals used to form the floating electrodes are known in the art. Accordingly further description is not necessary.

If the technology in accordance with the present invention is utilized, it is apparent that a higher breakdown voltage will be produced. It will also be easy to design the semiconductor device since it is possible to reduce the width of design margin. Particularly, in designing the vertical double-diffused MOSFET, it is possible to reduce resistive component in the substrate. As result of this, the total on-resistance can be decreased. Therefore, it is possible to manufacture the highly integrated semiconductor device having high stability for high voltage and current using the same size of semiconductor as the prior art.

The foregoing description of the preferred embodiments has been presented for purpose of illustration and description. It is not intended to limit the scope of this invention. Many modifications and variation are possible in the light of above teaching. It is intended that the scope of the invention be defined by the claims.

What is claimed is:

1. A semiconductor device having a high breakdown voltage comprising:
   a first conductivity type heavily doped silicon substrate having a first main surface and a second main surface;
   a first conductivity type lightly doped layer on said first main surface of said first conductivity type silicon substrate;
   at least one second conductivity type region positioned in a portion of said first conductivity type layer;
   a plurality of grooves formed in said first conductivity type layer proximates to said second conductivity type region;
   an insulating layer disposed on said first conductivity type layer, said second conductivity type region, and said plurality of grooves;
   said insulating layer further including an opening formed therethrough over said second conductivity type region;
   a first portion of conducting material formed into said opening to contact said second conductivity type region;
   a first electrode electrically connected to said first portion of conducting material;
   a second portion of conducting material disposed on said second main surface of said first conductivity type silicon substrate;
   a second electrode electrically connected to said second portion of conducting material;
   a third portion of conductive material disposed on said insulating layer in each groove of said plurality of grooves to form a plurality of floating electrodes; and
   said floating electrodes being electrically isolated from said first conductivity type layer to provide a high breakdown voltage to said device.

2. The semiconductor of claim 1 wherein said conducting material is polysilicon.

3. The semiconductor of claim 1 wherein said insulating material is glass.

4. The semiconductor of claim 1 wherein said floating electrode is polysilicon.

5. The semiconductor of claim 1 wherein said floating electrode includes a metal.

6. A semiconductor device having a high breakdown voltage comprising:
   a first conductivity type heavily doped silicon substrate having a first main surface and a second main surface;
   a first conductivity type lightly doped layer on said first main surface of said first conductivity type silicon substrate;
   at least one second conductivity type region positioned in a portion of said first conductivity type layer;
   a groove formed in said first conductivity type layer proximate to said second conductivity type region;
   an insulating layer disposed on said first conductivity type layer, said second conductivity type region, and said groove;
   said insulating layer further including an opening formed therethrough over said second conductivity type region;
   a first portion of conducting material formed into said opening and into said groove to contact said second conductivity type region thereby forming a field plate with high breakdown voltage;

a first electrode electrically connected to said first portion of conducting material;

a second portion of conducting material disposed on said second main surface of said first conductivity type silicon substrate; and a second electrode electrically connected to said second portion of conducting material.

7. The semiconductor of claim 6 wherein said conducting material is a polysilicon.

8. The semiconductor of claim 6 wherein said insulating material is a glass.

9. The semiconductor of claim 6 wherein said floating electrode is a polysilicon.

10. A semiconductor device having a high breakdown voltage comprising:

a first conductivity type heavily doped silicon substrate having a first main surface and a second main surface;

a first conductivity type lightly doped layer on said first main surface of said first conductivity type silicon substrate;

at least one second conductivity type region positioned in a portion of said first conductivity type layer;

a plurality of grooves formed in said first conductivity type layer proximate to said second conductivity type region;

an insulating layer disposed on said first conductivity type layer, said second conductivity type region, and said plurality of grooves;

said insulating layer further including an opening formed therethrough over said second conductivity type region;

a first portion of conducting material formed into said opening to contact said second conductivity type region;

a first electrode electrically connected to said first portion of conducting material;

a second portion of conducting material disposed on said second main surface of said first conductivity type silicon substrate;

a second electrode electrically connected to said second portion of conducting material;

a third portion of conductive material disposed on said insulating layer in each grove of said plurality of grooves to form a plurality of floating electrodes;

said floating electrodes being electrically isolated from aid first conductivity type layer to provide a high breakdown voltage to said device; and said plurality of grooves further including a groove formed in said first conductivity type layer adjacent to said second conductivity type region with said groove being coated by said insulating layer and where said first portion of conducting material further covers said insulating layer coated adjacent groove thereby forming a field plate with a high breakdown voltage.

11. The semiconductor of claim 10 wherein said conducting material polysilicon.

12. The semiconductor of claim 10 wherein said insulating material is a glass.

13. The semiconductor of claim 10 wherein said floating electrode is a polysilicon.

14. The semiconductor of claim 10 wherein said floating electrode includes a metal.

* * * * *